US011715690B2

(12) United States Patent
Huang

(10) Patent No.: US 11,715,690 B2
(45) Date of Patent: Aug. 1, 2023

(54) SEMICONDUCTOR DEVICE HAVING A CONDUCTIVE CONTACT WITH A TAPERING PROFILE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/031,073

(22) Filed: Sep. 24, 2020

(65) Prior Publication Data

US 2022/0093510 A1 Mar. 24, 2022

(51) Int. Cl.
*H01L 23/528* (2006.01)
*H01L 23/522* (2006.01)
*H10B 12/00* (2023.01)
*H01L 21/768* (2006.01)

(52) U.S. Cl.
CPC .... *H01L 23/5283* (2013.01); *H01L 21/76804* (2013.01); *H01L 21/76831* (2013.01); *H01L 23/5226* (2013.01); *H10B 12/01* (2023.02); *H10B 12/485* (2023.02); *H01L 2221/1063* (2013.01)

(58) Field of Classification Search
CPC ............... H01L 23/528; H01L 23/5283; H01L 23/5226; H01L 21/76807–76813; H01L 21/76877; H01L 21/76897; H01L 21/823475; H01L 21/76804; H01L 21/76816; H01L 27/10817; H01L 27/10823; H01L 27/10852; H01L 27/10885; H01L 27/10855; H01L 27/10888; H10B 12/485
See application file for complete search history.

(56) References Cited

U.S. PATENT DOCUMENTS

| | | | |
|---|---|---|---|
| 6,576,548 B1* | 6/2003 | Tu | H01L 21/76843 257/E21.585 |
| 8,736,056 B2* | 5/2014 | Lee | H01L 23/50 257/773 |
| 2007/0034955 A1* | 2/2007 | Kim | H01L 21/76804 438/257 |

(Continued)

FOREIGN PATENT DOCUMENTS

| | | |
|---|---|---|
| TW | 201115651 A | 5/2011 |
| TW | 201820538 A | 6/2018 |
| TW | 201826379 A | 7/2018 |

*Primary Examiner* — Younes Boulghassoul
(74) *Attorney, Agent, or Firm* — Muncy, Geissler, Olds & Lowe, P.C.

(57) ABSTRACT

The present disclosure relates to a semiconductor device including a conductive contact having a tapering profile and a method for preparing the semiconductor device. The semiconductor device includes a conductive layer disposed over a semiconductor substrate, and a conductive contact disposed over the conductive layer. The semiconductor device also includes a conductive line disposed over the conductive contact. An upper portion of the conductive contact has a tapering profile in a first cross-sectional view along a longitudinal axis of the conductive line, and the upper portion of the conductive contact has a non-tapering profile in a second cross-sectional view along a line orthogonal to the longitudinal axis of the conductive line.

5 Claims, 26 Drawing Sheets

(56) References Cited

U.S. PATENT DOCUMENTS

| | | | |
|---|---|---|---|
| 2007/0069299 A1* | 3/2007 | Beach | H01L 21/76895 257/E27.035 |
| 2009/0068835 A1* | 3/2009 | La Tulipe, Jr. | H01L 21/76898 257/E21.249 |
| 2009/0108461 A1* | 4/2009 | Kang | H10B 12/0335 438/618 |
| 2010/0164118 A1* | 7/2010 | Kim | H01L 27/10888 29/874 |
| 2012/0040527 A1* | 2/2012 | Kim | H01L 21/76828 438/667 |
| 2014/0210087 A1* | 7/2014 | Kang | H01L 23/528 257/774 |
| 2016/0049394 A1* | 2/2016 | Shin | H01L 21/76804 257/288 |
| 2016/0079115 A1 | 3/2016 | Lee et al. | |
| 2017/0317079 A1* | 11/2017 | Kim | H01L 21/823418 |
| 2018/0158828 A1* | 6/2018 | Han | H01L 27/10823 |
| 2018/0190809 A1* | 7/2018 | Huang | H01L 27/0886 |
| 2019/0295889 A1* | 9/2019 | Bai | H01L 29/517 |

\* cited by examiner

SEMICONDUCTOR DEVICE HAVING A CONDUCTIVE CONTACT WITH A TAPERING PROFILE

TECHNICAL FIELD

The present disclosure relates to a semiconductor device and a method for preparing the same, and more particularly, to a semiconductor device including a conductive contact having a tapering profile and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the structure and the manufacturing process of semiconductor devices so that the deficiencies can be addressed and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a conductive layer disposed over a semiconductor substrate, and a conductive contact disposed over the conductive layer. The semiconductor device also includes a conductive line disposed over the conductive contact. An upper portion of the conductive contact has a tapering profile in a first cross-sectional view along a longitudinal axis of the conductive line, and the upper portion of the conductive contact has a non-tapering profile in a second cross-sectional view along a line orthogonal to the longitudinal axis of the conductive line.

In an embodiment, the tapering profile of the upper portion of the conductive contact in the first cross-sectional view tapers from a top surface of the conductive contact. In an embodiment, a lower portion of the conductive contact has a non-tapering profile in the first cross-sectional view. In an embodiment, an interface area between the conductive contact and the conductive line is greater than an interface area between the conductive contact and the conductive layer. In an embodiment, the conductive contact is entirely covered by the conductive line. In an embodiment, a width of the conductive line is substantially the same as a width of the conductive contact in the second cross-sectional view. In an embodiment, the semiconductor device further includes a source/drain region disposed in the semiconductor substrate, wherein the conductive line is electrically connected to the source/drain region through the conductive contact and the conductive layer.

In another embodiment of the present disclosure, a semiconductor device is provided. The semiconductor device includes a conductive layer disposed over a semiconductor substrate, and a conductive line disposed over the conductive layer. The semiconductor device also includes a conductive contact disposed between and electrically connecting the conductive layer and the conductive line. The conductive contact includes a base portion, and a first expanded portion and a second expanded portion laterally extend from the base portion. The first expanded portion and the second expanded portion are separated from the conductive layer, and the first expanded portion and the second expanded portion have tapering profiles that taper from the conductive line toward the conductive layer.

In an embodiment, the first expanded portion of the conductive contact is separated from the second expanded portion of the conductive contact, and the first expanded portion and the second expanded portion are entirely covered by the conductive line. In an embodiment, the first expanded portion and the second expanded portion of the conductive contact are in direct contact with the conductive line. In an embodiment, top surfaces of the first expanded portion and the second expanded portion of the conductive contact are substantially coplanar with a top surface of the base portion of the conductive contact. In an embodiment, a height of the base portion of the conductive contact is greater than a height of the first expanded portion of the conductive contact and a height of the second expanded portion of the conductive contact in a cross-sectional view along a longitudinal axis of the conductive line. In an embodiment, the first expanded portion and the second expanded portion of the conductive contact have curved sidewalls.

In yet another embodiment of the present disclosure, a method for forming a semiconductor device is provided. The method includes forming a conductive layer over a semiconductor substrate, and forming a dielectric layer covering the conductive layer. The method also includes etching the dielectric layer to form an opening exposing the conductive layer, and etching the dielectric layer to form a first recess and a second recess connecting to the opening. A depth of the opening is greater than a depth of the first recess and a depth of the second recess, and the first recess and the second recess have tapering profiles that taper toward the conductive layer. The method further includes forming a conductive contact over the conductive layer. The opening, the first recess and the second recess are filled by the conductive contact. In addition, the method includes forming a conductive line over the conductive contact.

In an embodiment, the opening has a non-tapering profile. In an embodiment, the step of etching the dielectric layer to form the first recess and the second recess includes depositing a liner film covering the dielectric layer and lining the opening, etching the liner film to expose portions of the dielectric layer adjacent to the opening, and etching the portions of the dielectric layer exposed by the liner film to form the first recess and the second recess. In an embodiment, the conductive layer is exposed after the liner film is etched. In an embodiment, the method further includes removing the liner film after the first recess and the second recess are formed. In an embodiment, the step of forming the conductive contact over the conductive layer includes forming a conductive material over the dielectric layer, wherein the opening, the first recess and the second recess are filled by the conductive material. In addition, the step of forming the conductive contact over the conductive layer includes polishing the conductive material to form the conductive contact. In an embodiment, a top surface area of the conductive contact is greater than a bottom surface area of the conductive contact, and the top surface of the conductive contact is entirely covered by the conductive line.

Embodiments of a semiconductor device and method for preparing the same are provided in the disclosure. In some embodiments, the semiconductor device includes a conductive contact disposed over a conductive layer, and a conductive line disposed over the conductive contact. The upper portion of the conductive contact has a tapering profile in a cross-sectional view along a longitudinal axis of the conductive line. Therefore, the contact resistance between the conductive contact and the conductive line may be reduced. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
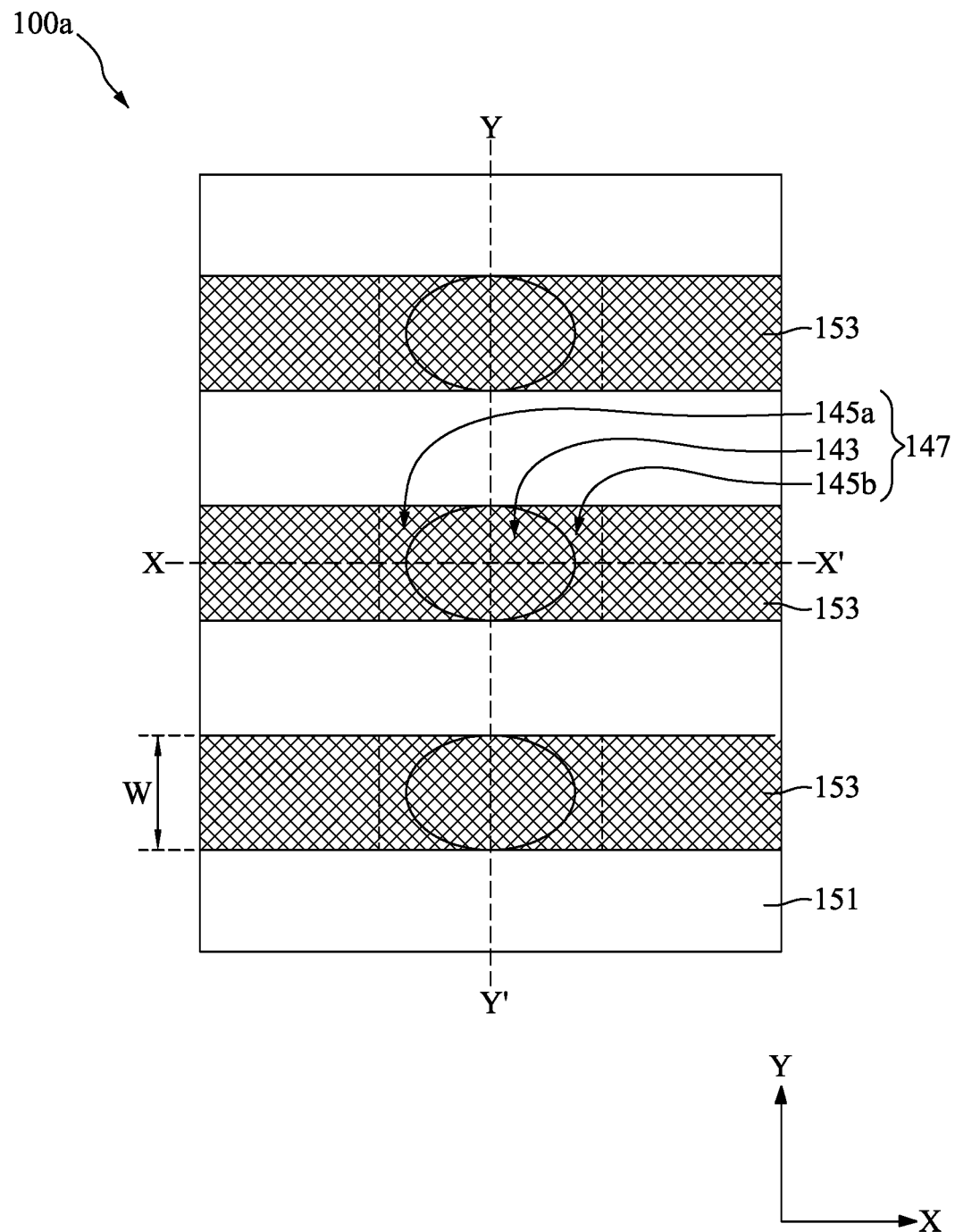
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
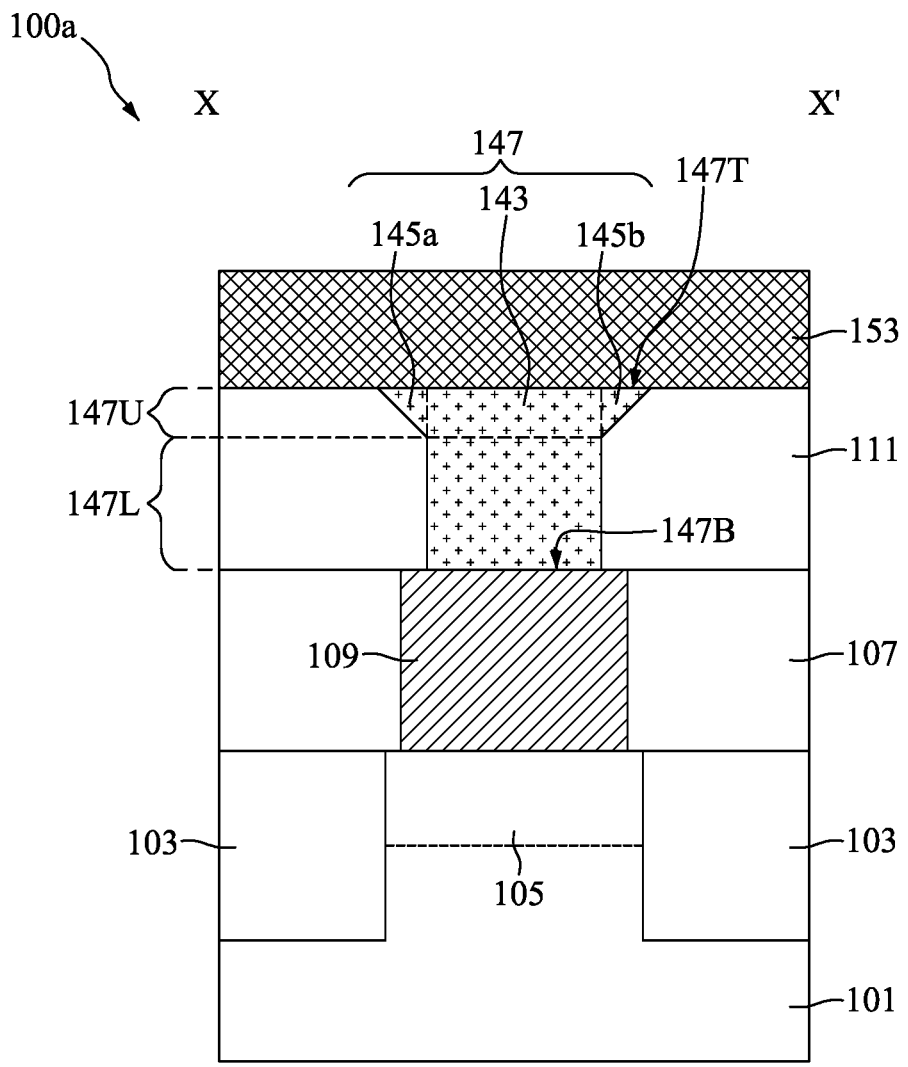
FIG. 2 is a cross-sectional view illustrating the semiconductor device along the sectional line X-X' in FIG. 1, in accordance with some embodiments.
Figure 3:
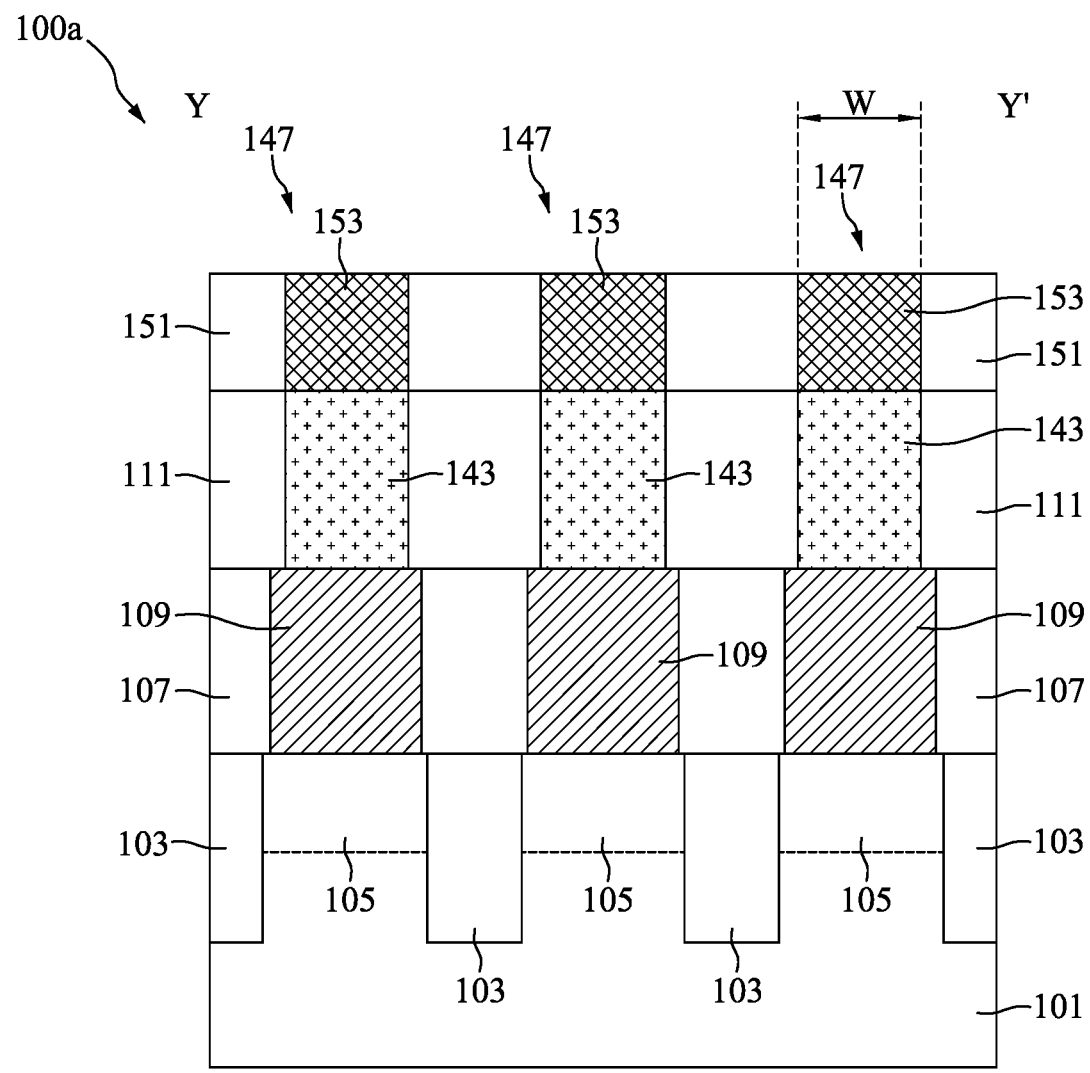
FIG. 3 is a cross-sectional view illustrating the semiconductor device along the sectional line Y-Y' in FIG. 1, in accordance with some embodiments.

FIG. 1 is a top view illustrating a semiconductor device 100a, FIG. 2 is a cross-sectional view illustrating the semiconductor device 100a along the sectional line X-X' in FIG. 1, and FIG. 3 is a cross-sectional view illustrating the semiconductor device 100a along the sectional line Y-Y' in FIG. 1, in accordance with some embodiments.

As shown in FIGS. 1 to 3, the semiconductor device 100a includes a semiconductor substrate 101, a plurality of source/drain (S/D) regions 105 disposed in the semiconductor substrate 101, a plurality of conductive layers 109 disposed over the source/drain regions 105, a plurality of conductive contacts 147 disposed over the conductive layers 109, and a plurality of conductive lines 153 disposed over the conductive contacts 147. In some embodiments, the conductive lines 153 are electrically connected to the S/D regions 105 through the conductive contacts 147 and the conductive layers 109. In some embodiments, each of the conductive contacts 147 includes a base portion 143, a first expanded portion 145a and a second expanded portion 145b.

In some embodiments, the semiconductor device 100a includes an isolation structure 103 disposed in the semiconductor substrate 101, and a plurality of active areas (not shown) defined by the isolation structure 103. The S/D regions 105 are disposed in the active areas. In some embodiments, the semiconductor device 100a also includes a dielectric layer 107 disposed over the semiconductor substrate 101 and surrounding the conductive layers 109, a dielectric layer 111 disposed over the dielectric layer 107 and surrounding the conductive contacts 147 (including the base portions 143, the first expanded portions 145a and the second expanded portions 145b), and a dielectric layer 151 disposed over the dielectric layer 111 and surrounding the conductive lines 153.

Referring to FIG. 1, the conductive lines 153 are parallel to each other, in accordance with some embodiments. In some embodiments, the conductive lines 153 extend along the X-direction. Specifically, each of the conductive lines 153 has a longitudinal axis along the X-direction, and the sectional line X-X' is the longitudinal axis of one of the conductive lines 153. In addition, the sectional line Y-Y' extends along the Y-direction. That is, the sectional line Y-Y' is orthogonal to the longitudinal axis of the conductive lines 153.

Moreover, an upper portion 147U of the conductive contact 147 has a tapering profile, and a lower portion 147L of the conductive contact 147 has a non-tapering profile in the cross-sectional view along the longitudinal axis of the conductive line 153, as shown in FIG. 2 in accordance with some embodiments. Specifically, the tapering profile of the upper portion 147U of the conductive contact 147 tapers from the conductive line 153 towards the conductive layer 109. In some embodiments, the top surface area 147T of the conductive contact 147 is greater than the bottom surface area 147B of the conductive contact 147. Therefore, the contact resistance between the conductive contact 147 and the conductive line 153 may be reduced.

Turning to FIG. 3, the conductive contacts 147 have non-tapering profiles in the cross-sectional view along the line orthogonal to the longitudinal axis of the conductive lines 153, in accordance with some embodiments. In some embodiments, the sectional line Y-Y' depicts a cross-sectional view that cuts through the base portions 143 of the conductive contacts 147 but that does not cut through the first expanded portions 145a and the second expanded portions 145b of the conductive contacts 147, and thus the first expanded portions 145a and the second expanded portions 145b are not illustrated in FIG. 3.

Moreover, each of the conductive contacts 147 has a width substantially the same as a width of a respective conductive line 153 (indicated as "W"), as shown in FIGS. 1 and 3 in accordance with some embodiments. Within the context of this disclosure, the word "substantially" means preferably at least 90%, more preferably 95%, even more preferably 98%, and most preferably 99%. Since the first expanded portions 145a and the second expanded portions 145b do not extend beyond edges of the respective conductive lines 153, crosstalk (i.e., signal interference) between adjacent conductive lines 153 or conductive contacts 147 may be prevented or reduced.

In some embodiments, the semiconductor device 100a is a dynamic random access memory (DRAM), and the conductive lines 153 serve as bit lines (BL) or storage nodes for the DRAM. In some embodiments, the conductive contacts 147 have expanded portions (i.e., the first expanded portions 145a and the second expanded portions 145b) laterally extend outward from the base portions 143 and along the longitudinal axis of the conductive lines 153. Therefore, the top surface areas (e.g., the top surface area 147T) of the conductive contacts 147 are greater than the bottom surface areas (e.g., the bottom surface area 147B) of the conductive contacts 147, thereby reducing the contact resistance between the conductive contacts 147 and the conductive lines 153. In addition, the conductive contacts 147 do not expand beyond edges of the conductive lines 153, thereby preventing or reducing crosstalk problems between adjacent conductive lines 153 or conductive contacts 147. As a result, the overall device performance may be improved.

Figure 4:
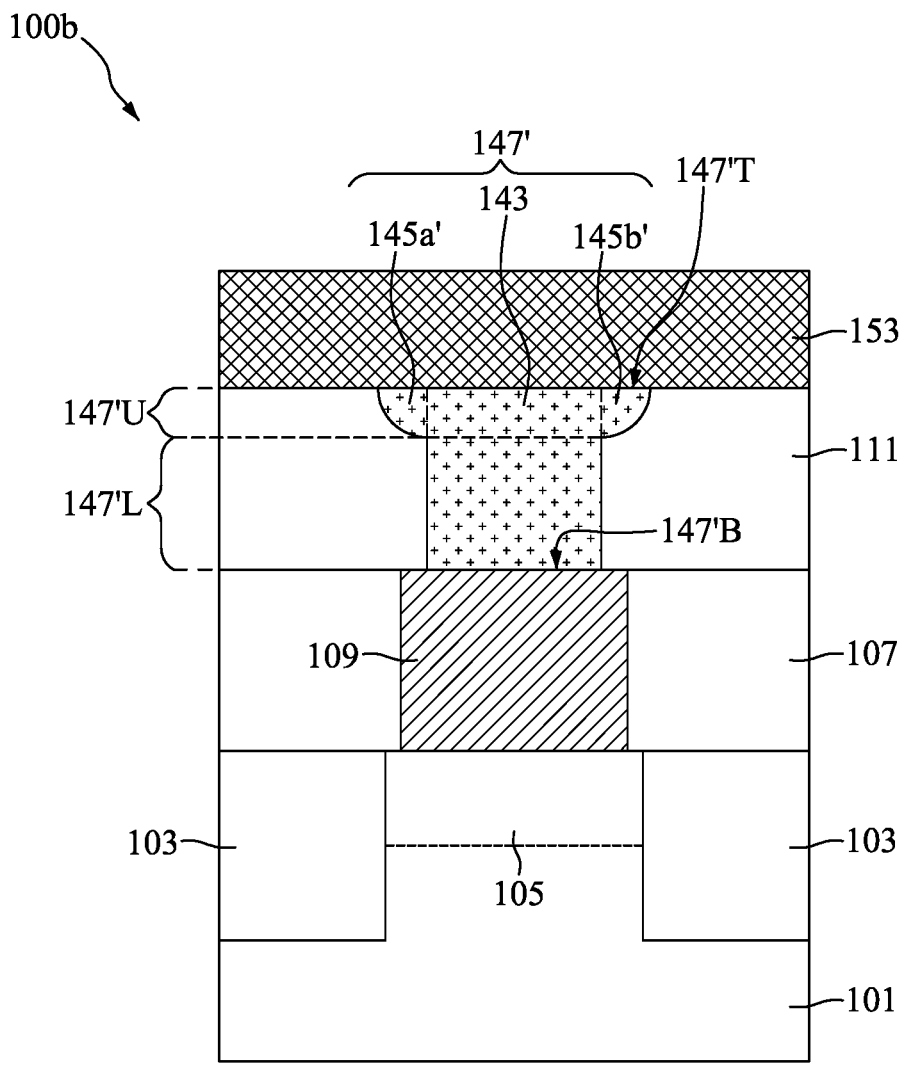
FIG. 4 is a cross-sectional view illustrating a modified semiconductor device, in accordance with some embodiments.

FIG. 4 is a cross-sectional view illustrating a modified semiconductor device 100*b*, which is an alternative embodiment of the semiconductor device 100*a*, in accordance with some embodiments. Similar to FIG. 2, FIG. 4 is a cross-sectional view taken along a line parallel to the sectional line X-X' in FIG. 1. For reasons of consistency and clarity, similar components appearing in both FIGS. 2 and 4 will be labeled the same.

Similar to the semiconductor device 100*b*, the modified semiconductor device 100*a* includes a conductive contact 147', and the conductive contact 147' has a first expanded portion 145*a*' and a second expanded portion 145*b*' laterally extend outward from the base portion 143. In some embodiments, an upper portion 147'U of the conductive contact 147' has a tapering profile, and a lower portion 147'L of the conductive contact 147' has a non-tapering profile. Specifically, the tapering profile of the upper portion 147'U of the conductive contact 147' tapers from the conductive line 153 towards the conductive layer 109. In some embodiments, the top surface area 147'T of the conductive contact 147 is greater than the bottom surface area 147'B of the conductive contact 147.

A difference between the semiconductor devices 100*a* and 100*b* is that the first expanded portion 145*a*' and the second expanded portion 145*b*' of the conductive contact 147' of the modified semiconductor device 100*b* have curved sidewalls, as shown in FIG. 4 in accordance with some embodiments.

Figure 5:
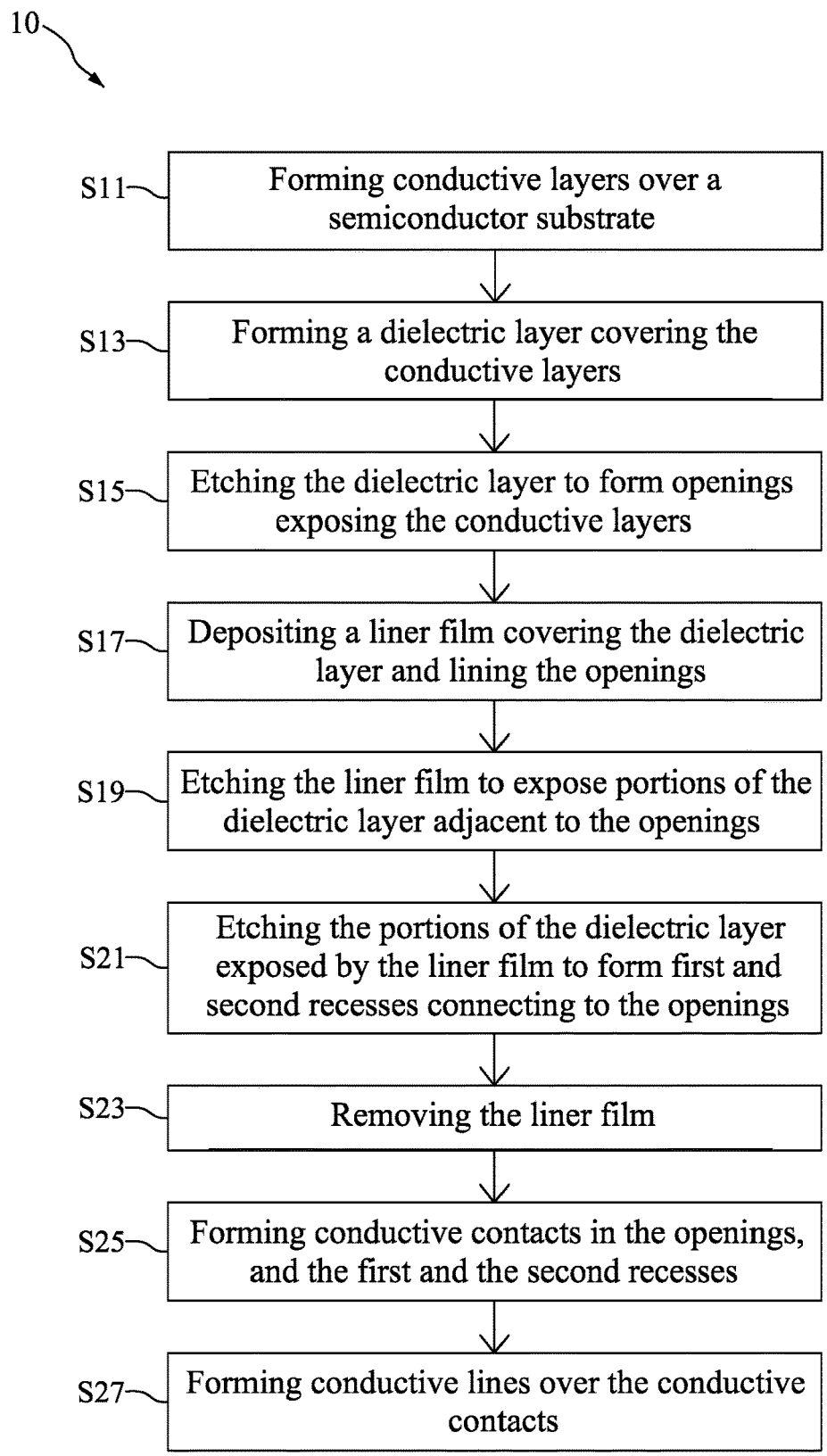
FIG. 5 is a flow diagram illustrating a method for forming a semiconductor device, in accordance with some embodiments.

FIG. 5 is a flow diagram illustrating a method 10 for forming a semiconductor device (including the semiconductor device 100*a* and the modified semiconductor device 100*b*), and the method 10 includes steps S11, S13, S15, S17, S19, S21, S23, S25 and S27, in accordance with some embodiments. The steps S11 to S27 of FIG. 5 are elaborated in connection with the following figures.

FIGS. 6, 9, 12, 15, 18, 21 and 24 are top views illustrating intermediate stages in the formation of the semiconductor device 100*a*, and FIGS. 7, 8, 10, 11, 13, 14, 16, 17, 19, 20, 22, 23, 25 and 26 are cross-sectional views illustrating intermediate stages in the formation of the semiconductor device 100*a*, in accordance with some embodiments. It should be noted that FIGS. 7, 10, 13, 16, 19, 22 and 25 are cross-sectional views along the sectional line X-X' of FIGS. 6, 9, 12, 15, 18, 21 and 24, respectively, and FIGS. 8, 11, 14, 17, 20, 23 and 26 are cross-sectional views along the sectional line Y-Y' of FIGS. 6, 9, 12, 15, 18, 21 and 24, respectively.

Figure 6:
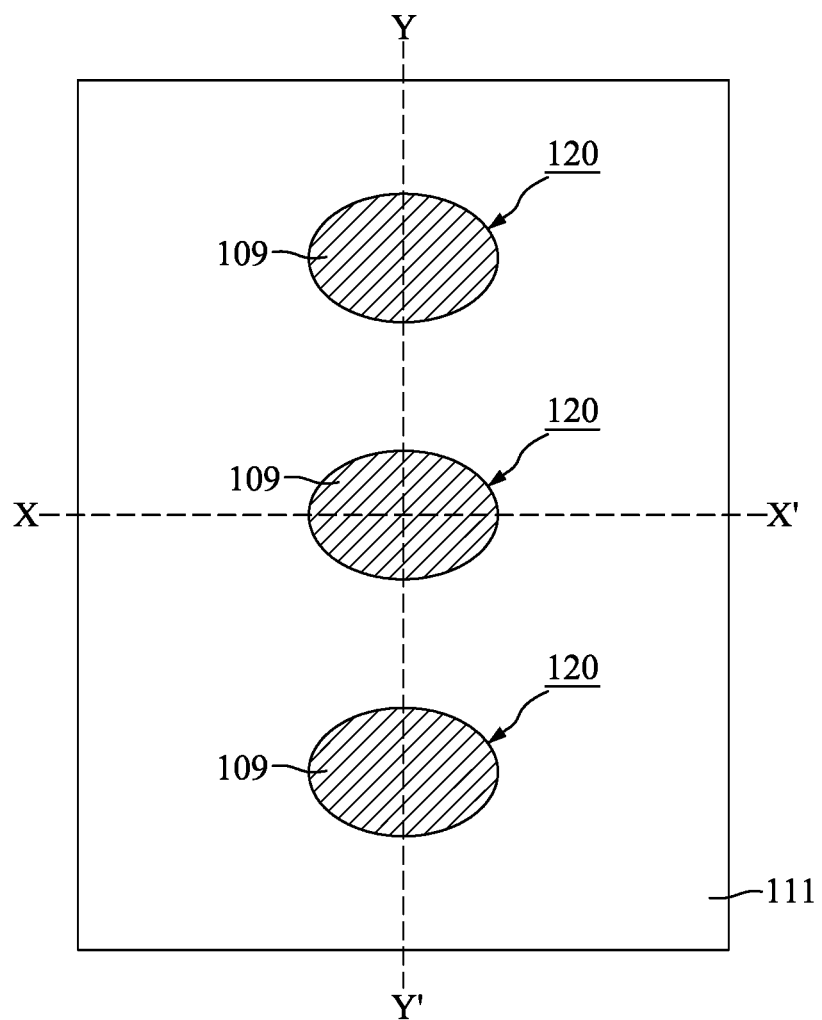
FIG. 6 is a top view illustrating an intermediate stage of etching a dielectric layer to form openings during the formation of the semiconductor device, in accordance with some embodiments.
Figure 7:
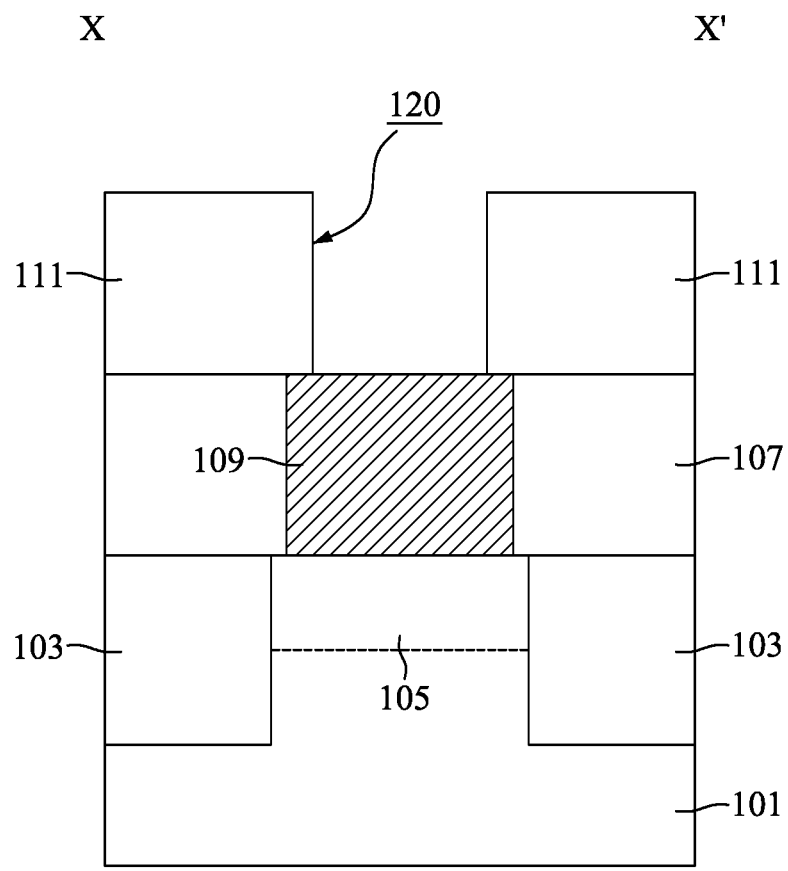
FIG. 7 is a cross-sectional view illustrating an intermediate stage in the formation of the semiconductor device along the sectional line X-X' in FIG. 6, in accordance with some embodiments.
Figure 8:
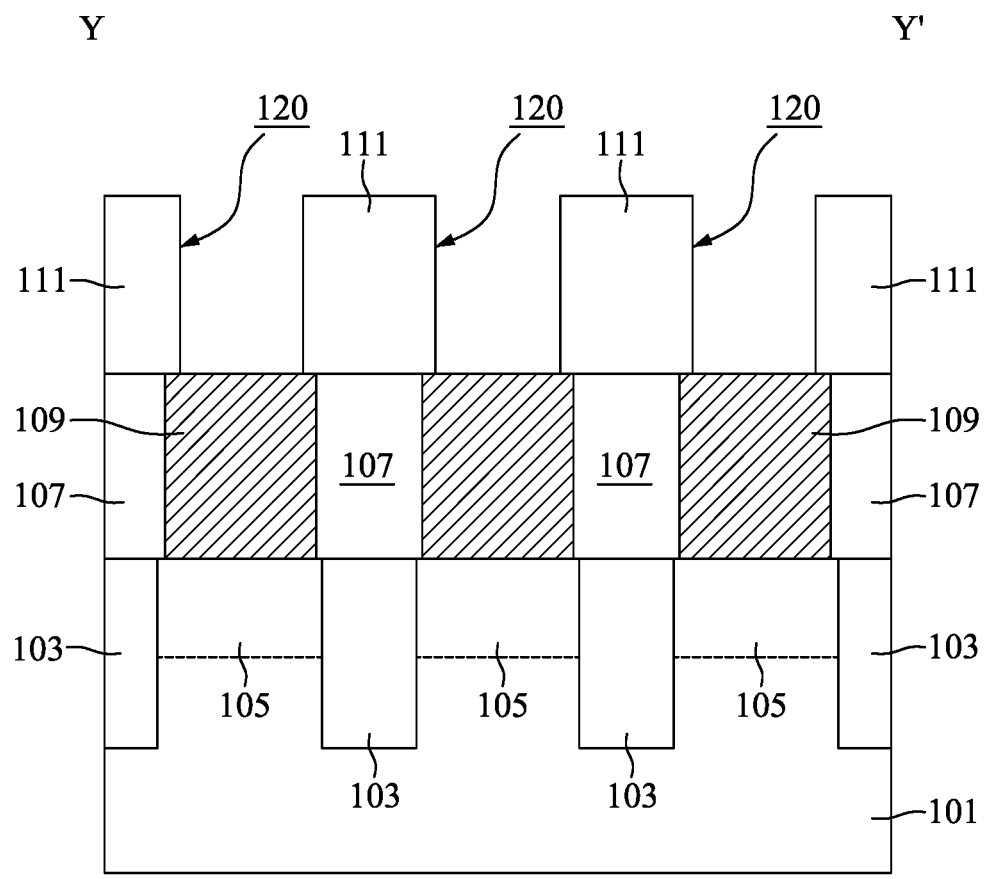
FIG. 8 is a cross-sectional view illustrating an intermediate stage in the formation of the semiconductor device along the sectional line Y-Y' in FIG. 6, in accordance with some embodiments.

As shown in FIGS. 6, 7 and 8, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

In some embodiments, the isolation structure 103 is formed in the semiconductor substrate 101 to define active areas, and the isolation structure 103 is a shallow trench isolation (STI) structure. In addition, the isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and polishing the dielectric material until the semiconductor substrate 101 is exposed.

Moreover, the S/D regions 105 are formed in the active areas. In some embodiments, the S/D regions 105 are formed by one or more ion implantation processes, and P-type dopants, such as boron (B), gallium (Ga), or indium (In), or N-type dopants, such as phosphorous (P) or arsenic (As), can be implanted in the active areas to form the S/D regions 105, depending on the conductivity type of the semiconductor device 100*a*.

After the S/D regions 105 and the isolation structure 103 are formed, the conductive layers 109 and the dielectric layer 107 surrounding the conductive layers 109 are formed over the semiconductor substrate 101, as shown in FIGS. 6, 7 and 8 in accordance with some embodiments. The respective step is illustrated as the step S11 in the method 10 shown in FIG. 5. Each of the conductive layers 109 may be a single layer or multiple layers. In some embodiments, the conductive layers 109 include aluminum (Al), copper (Cu), tungsten (W), titanium (Ti), tantalum (Ta), or another applicable conductive material. Moreover, the dielectric layer 107 may be a single layer or multiple layers, and the dielectric layer 107 includes silicon oxide, silicon nitride, silicon oxynitride, or another applicable dielectric material.

The conductive layers 109 and the dielectric layer 107 may be formed by depositing the dielectric layer 107 over the semiconductor substrate 101, etching the dielectric layer 107 to form openings (not shown) exposing the semiconductor substrate 101, depositing a conductive material (not shown) in the openings and over the dielectric layer 107, and polishing the conductive material to form the conductive layers 109 surrounded by the dielectric layer 107.

The deposition process of the dielectric layer 109 may include a chemical vapor deposition (CVD) process, a physical vapor deposition (PVD) process, an atomic layer deposition (ALD) process, a spin-on coating process, or another applicable process. The dielectric layer 109 may be etched by a wet etching process, a dry etching process, or a combination thereof. The deposition process of the conductive material may include a CVD process, a PVD process, an ALD process, a metal organic chemical vapor deposition (MOCVD) process, a sputtering process, a plating process, or another applicable process. The conductive material may be polished by a chemical mechanical polishing (CMP) process.

Then, the dielectric layer 111 is formed over the dielectric layer 107, and the conductive layers 109 are covered by the dielectric layer 111, in accordance with some embodiments. The respective step is illustrated as the step S13 in the method 10 shown in FIG. 5. Some materials and processes used to form the dielectric layer 111 are similar to, or the same as those used to form the dielectric layer 107, and details thereof are not repeated herein.

Subsequently, an etching process is performed on the dielectric layer 111 to form openings 120 exposing the conductive layers 109, as shown in FIGS. 6, 7 and 8 in accordance with some embodiments. The respective step is illustrated as the step S15 in the method 10 shown in FIG. 5. The etching process may include a wet etching process, a dry etching process, or a combination thereof. In some embodiments, each of the openings 120 exposes a respective conductive layer 109.

Figure 9:
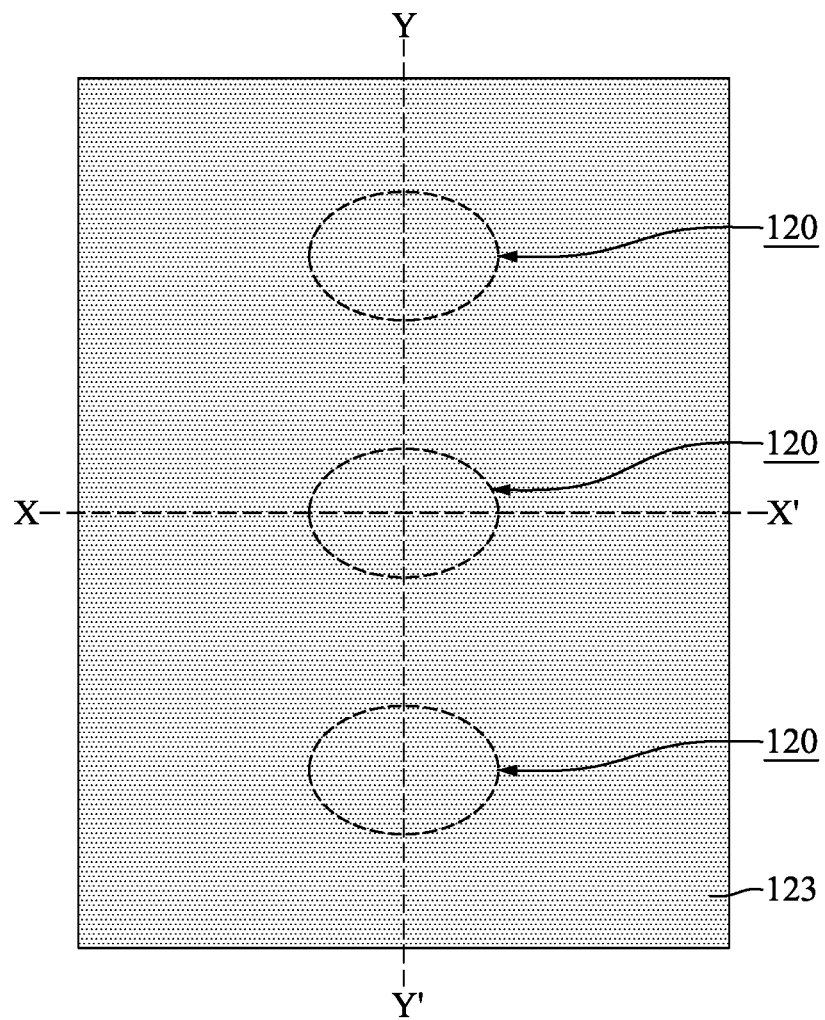
FIG. 9 is a top view illustrating an intermediate stage of forming a liner film over the dielectric layer and lining the openings during the formation of the semiconductor device, in accordance with some embodiments.
Figure 10:
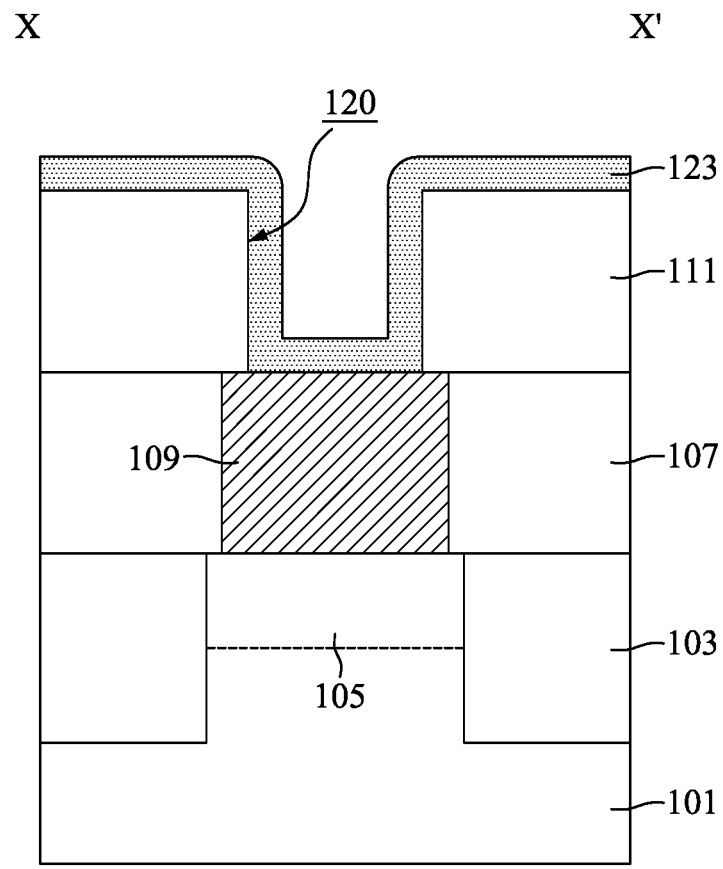
FIG. 10 is a cross-sectional view illustrating an intermediate stage in the formation of the semiconductor device along the sectional line X-X' in FIG. 9, in accordance with some embodiments.
Figure 11:
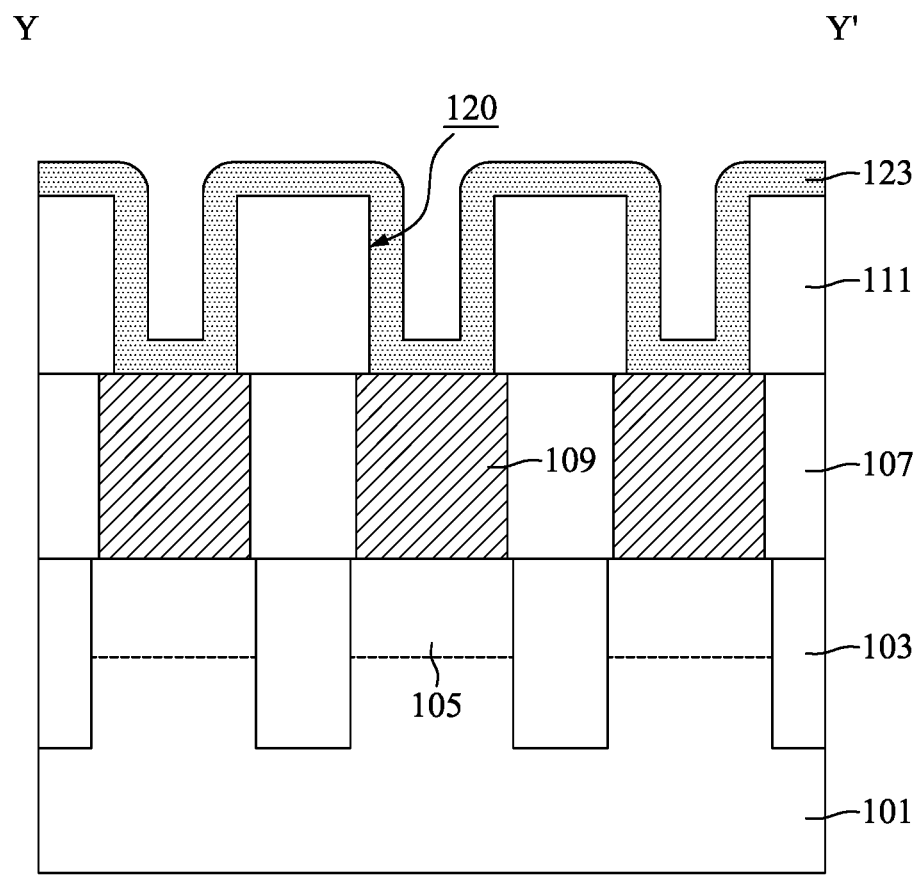
FIG. 11 is a cross-sectional view illustrating an intermediate stage in the formation of the semiconductor device along the sectional line Y-Y' in FIG. 9, in accordance with some embodiments.

Next, a liner film 123 is deposited to cover the dielectric layer 111 and to line the openings 120, as shown in FIGS. 9, 10 and 11 in accordance with some embodiments. The respective step is illustrated as the step S17 in the method 10 shown in FIG. 5. In some embodiments, the liner film 123 is made of a dielectric material, such as silicon oxide, silicon nitride, silicon oxynitride, and is formed by a deposition process, such as a CVD process, a PVD process, an ALD process, a spin-on coating process.

In some embodiments, the liner film 123 is formed from a material that has a high etching selectivity compared to the material of the dielectric layer 111. It should be noted that the liner film 123 is conformally deposited over the structure of FIGS. 6, 7 and 8. In some embodiments, the top surface and the sidewalls of the dielectric layer 111 and the exposed top surfaces of the conductive layers 109 are covered by the liner film 123.

Figure 12:
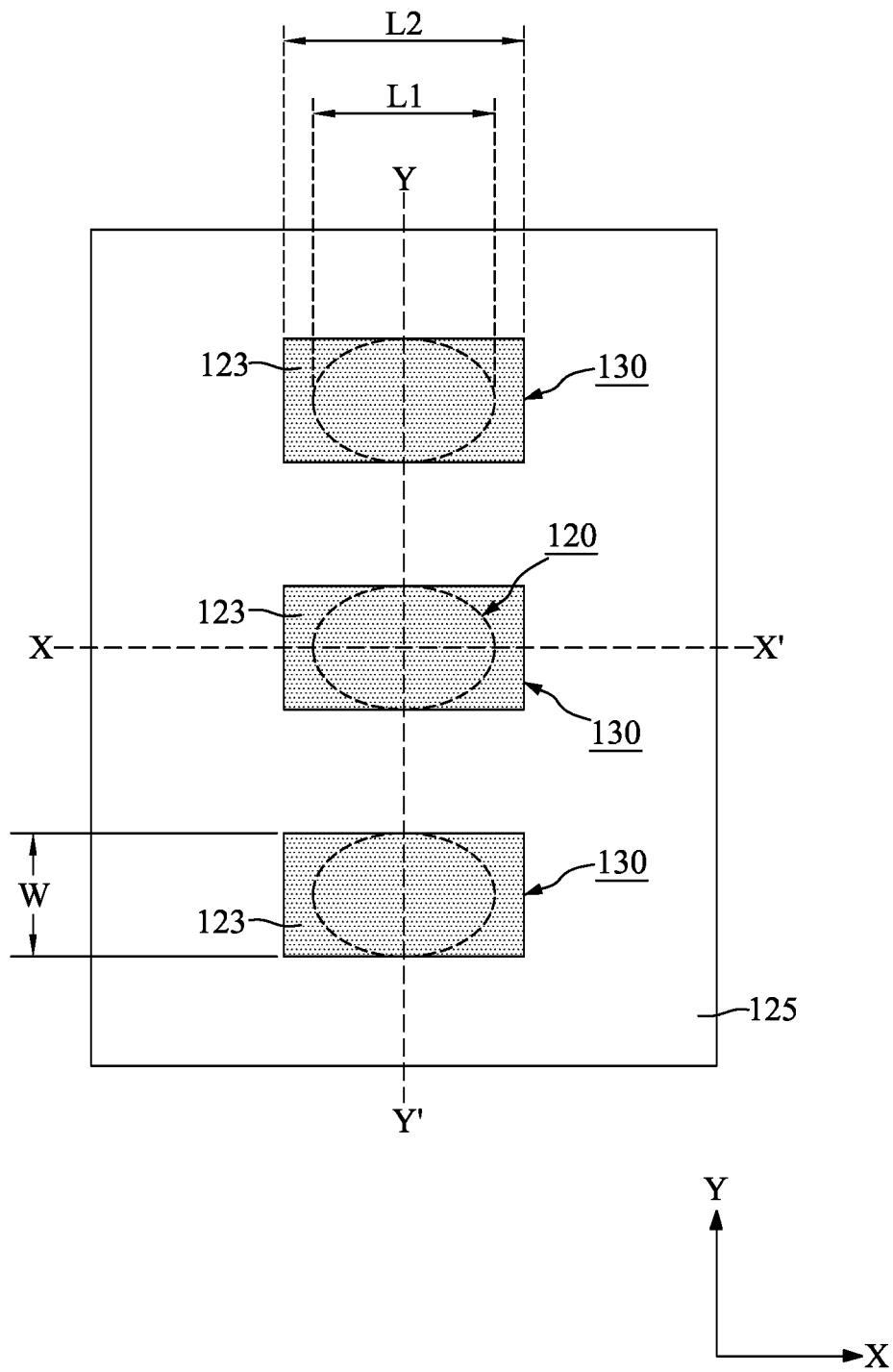
FIG. 12 is a top view illustrating an intermediate stage of forming a patterned mask over the liner film during the formation of the semiconductor device, in accordance with some embodiments.
Figure 13:
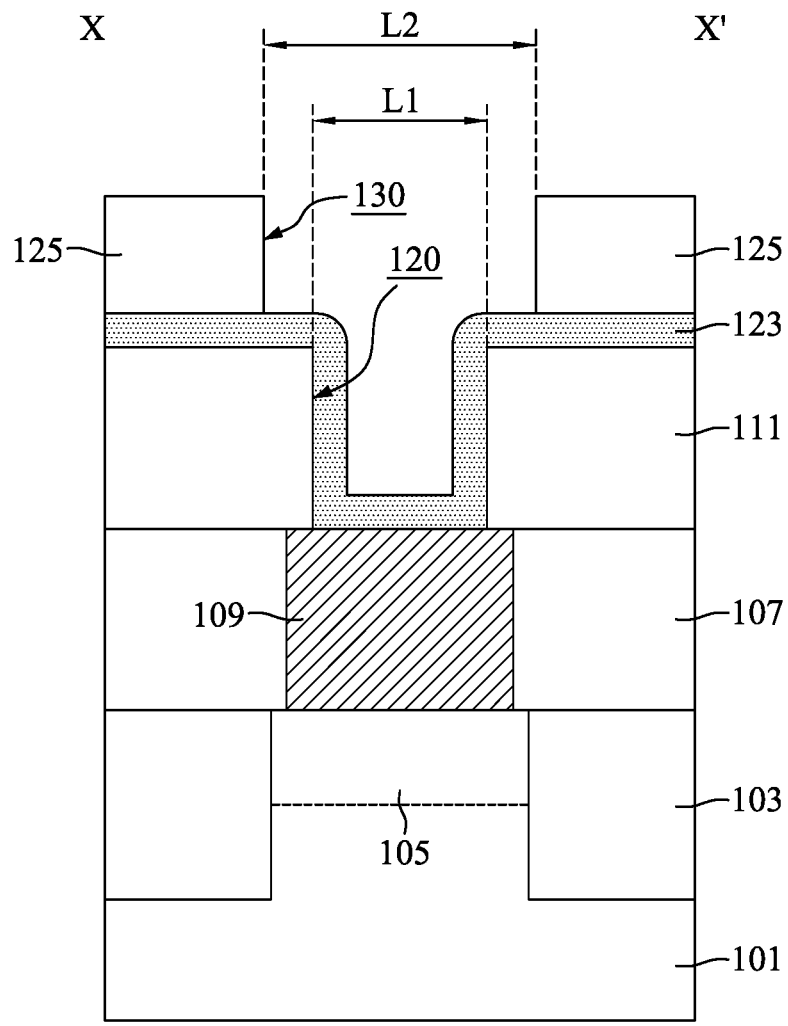
FIG. 13 is a cross-sectional view illustrating an intermediate stage in the formation of the semiconductor device along the sectional line X-X' in FIG. 12, in accordance with some embodiments.
Figure 14:
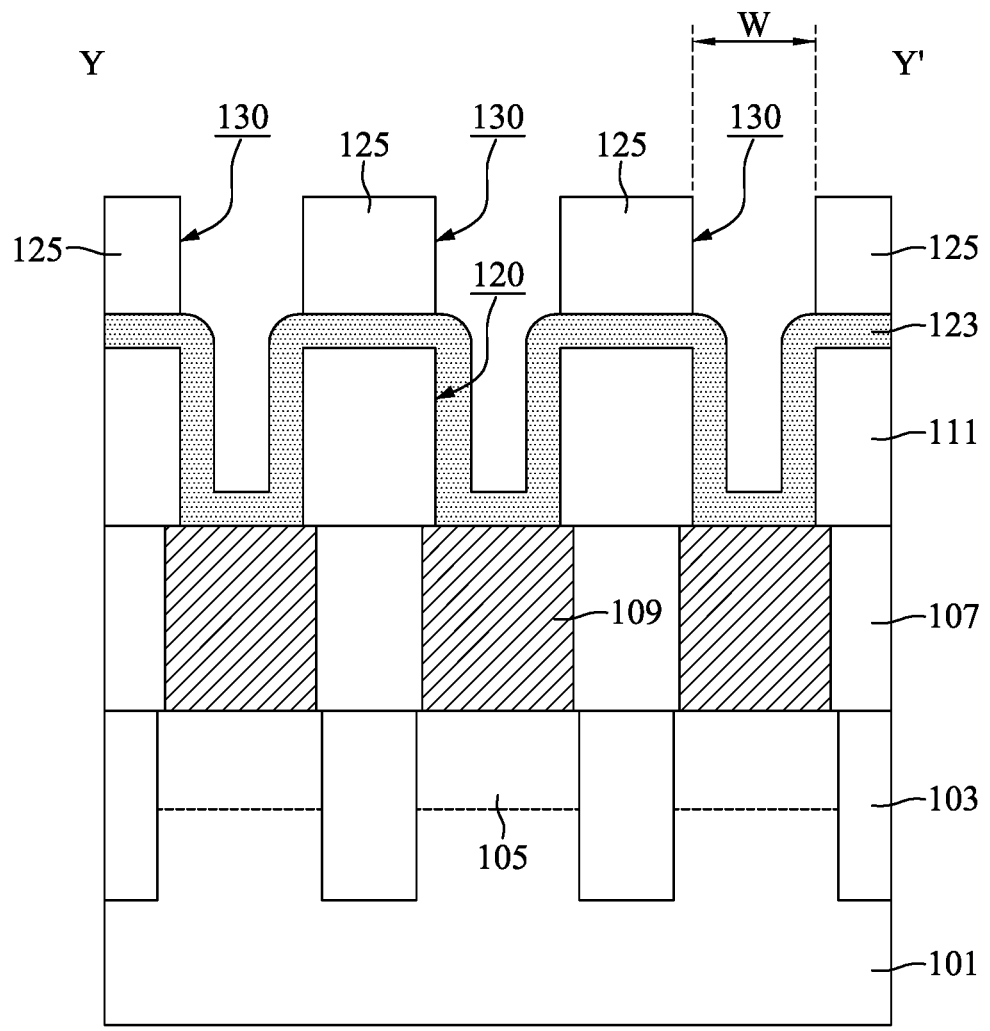
FIG. 14 is a cross-sectional view illustrating an intermediate stage in the formation of the semiconductor device along the sectional line Y-Y' in FIG. 12, in accordance with some embodiments.

After the liner film 123 is formed, a patterned mask 125 is formed over the liner film 123, as shown in FIGS. 12, 13 and 14 in accordance with some embodiments. In some embodiments, the patterned mask 125 has a plurality of openings 130 exposing the portions of the liner film 123 in the openings 120. It should be noted that each of the openings 130 is greater than the respective openings 120 in the dielectric layer 111. Therefore, the portions of the liner film 123 over the top surface of the dielectric layer 111 and adjacent to the openings 120 are exposed by the patterned mask 125.

Specifically, each of the openings 120 has a length L1 along the X-direction, and each of the openings 130 has a length L2 along the X-direction. In some embodiments, the length L2 is greater than the length L1. Moreover, each of the openings 120 has a width along the Y-direction and substantially the same as a width of a respective opening 130 along the Y-direction (indicated as "W").

Figure 15:
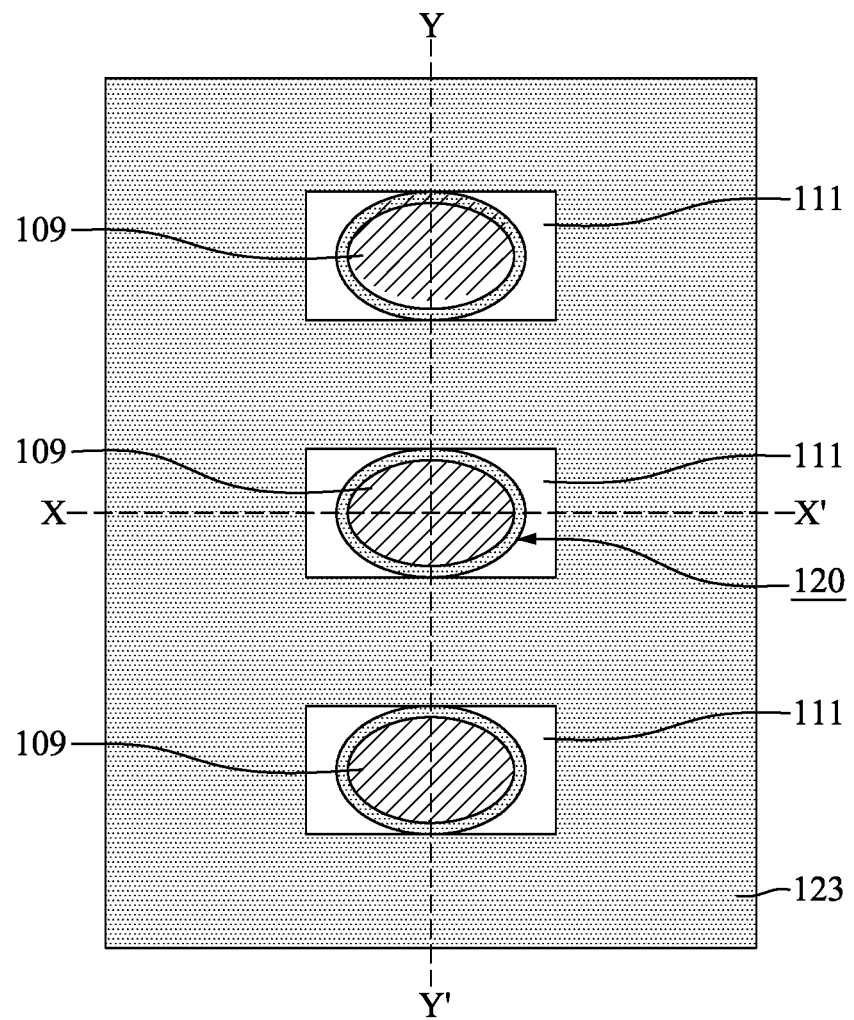
FIG. 15 is a top view illustrating an intermediate stage of etching the liner film to expose the dielectric layer by using the patterned mask as a mask during the formation of the semiconductor device, in accordance with some embodiments.
Figure 16:
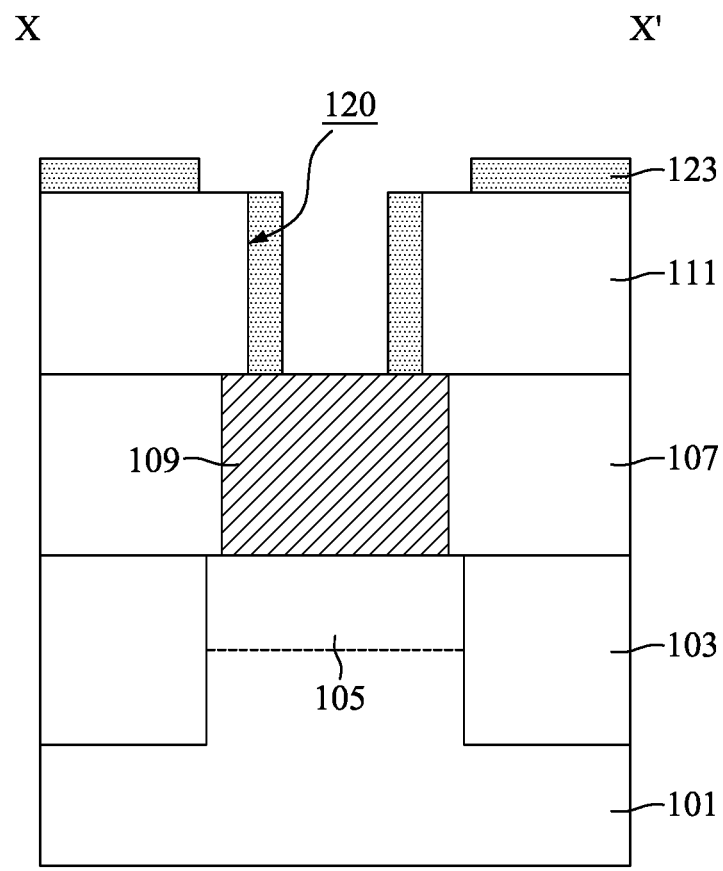
FIG. 16 is a cross-sectional view illustrating an intermediate stage in the formation of the semiconductor device along the sectional line X-X' in FIG. 15, in accordance with some embodiments.
Figure 17:
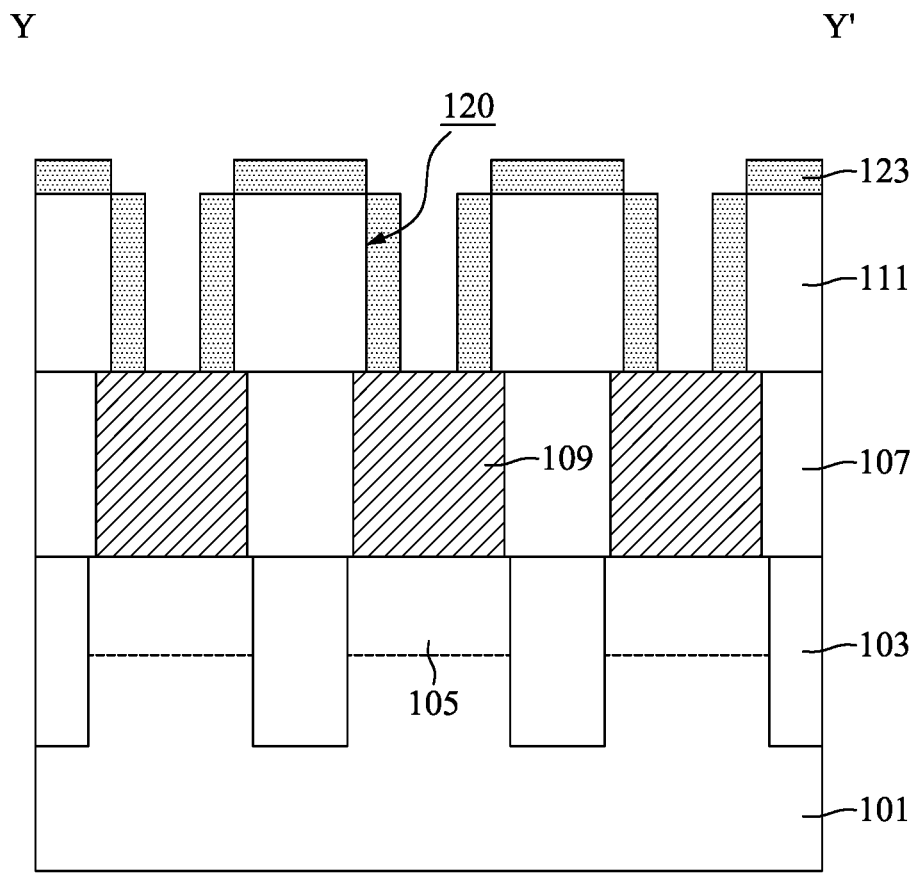
FIG. 17 is a cross-sectional view illustrating an intermediate stage in the formation of the semiconductor device along the sectional line Y-Y' in FIG. 15, in accordance with some embodiments.

Next, the liner film 123 is etched by using the patterned mask 125 as a mask, such that the portions of the dielectric layer 111 adjacent to the openings 120 are exposed, as shown in FIGS. 15, 16 and 17 in accordance with some embodiments. The respective step is illustrated as the step S19 in the method 10 shown in FIG. 5. In some embodiments, the conductive layers 109 are partially exposed after the liner film 123 is etched.

In particular, the liner film 123 is etched by a directional, or anisotropic, etching process to etch vertically through the liner film 123 with minimal lateral etching. The etching process may be a dry etching process, a wet etching process, or a combination thereof. As a result, the portions of the liner film 123 covered by the patterned mask 125 and the vertical portions of the liner film 123 on the sidewalls of the openings 120 remain, and the top surface of the dielectric layer 111 and the top surfaces of the conductive layers 109 are partially exposed, in accordance with some embodiments. After the portions of the top surface of the dielectric layer 111 adjacent to the openings 120 are exposed, the patterned mask 125 may be removed.

In the cross-sectional view of FIG. 16, since the length L2 of the opening 130 is greater than the length L1 of the opening 120 (See FIG. 13), the portions of the top surface of the dielectric layer 111 adjacent to the openings 120 are exposed by the remaining portions of the liner film 123, in accordance with some embodiments. In the cross-sectional view of FIG. 17, since the widths W of the openings 130 are substantially the same as the widths W of the openings 120 (See FIG. 14), the top surface of the dielectric layer 111 shown in FIG. 17 is entirely covered by the remaining portions of the liner film 123, in accordance with some embodiments.

Figure 18:
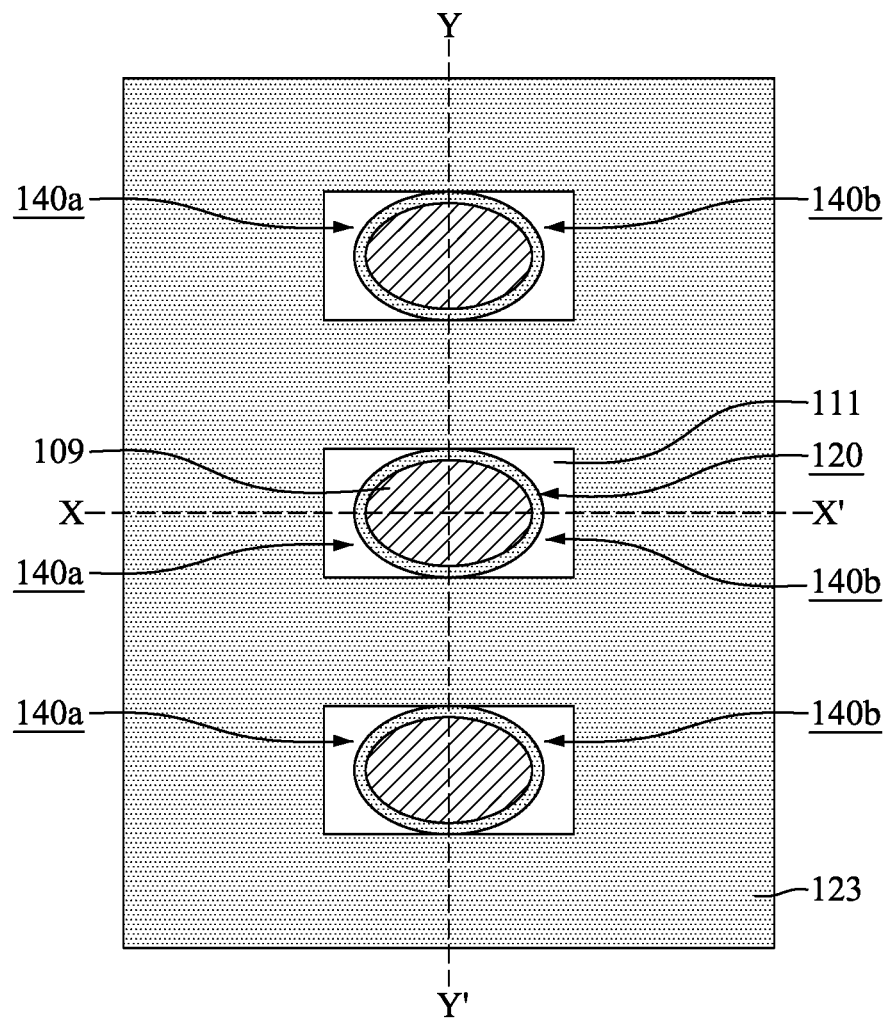
FIG. 18 is a top view illustrating an intermediate stage of etching the dielectric layer exposed by the liner film during the formation of the semiconductor device, in accordance with some embodiments.
Figure 19:
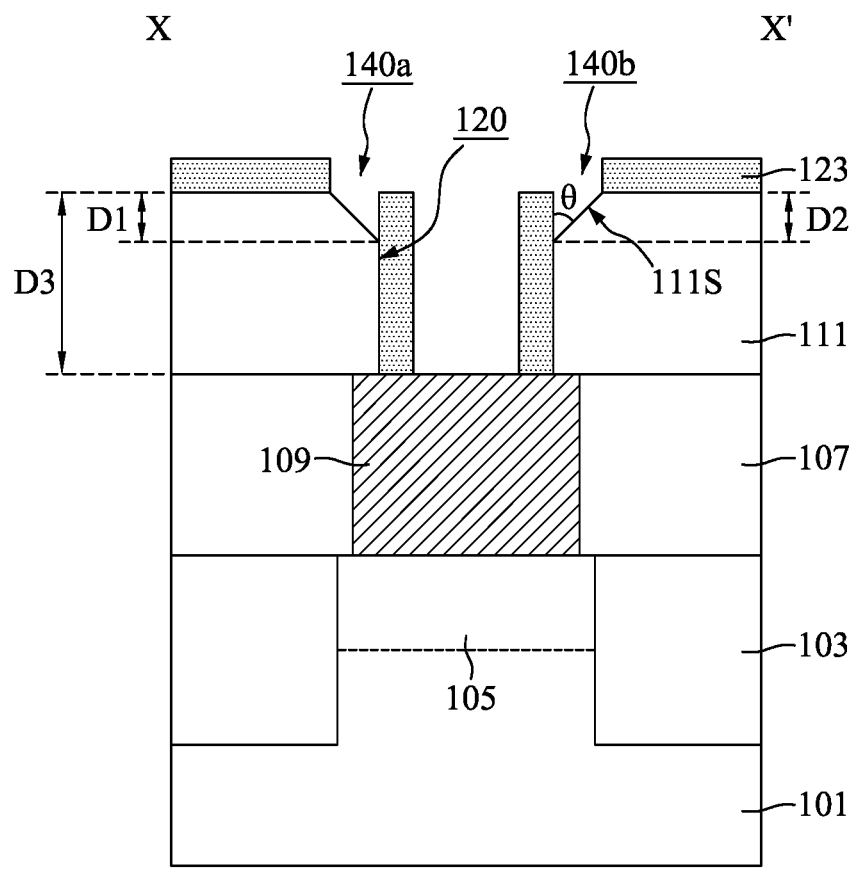
FIG. 19 is a cross-sectional view illustrating an intermediate stage in the formation of the semiconductor device along the sectional line X-X' in FIG. 18, in accordance with some embodiments.
Figure 20:
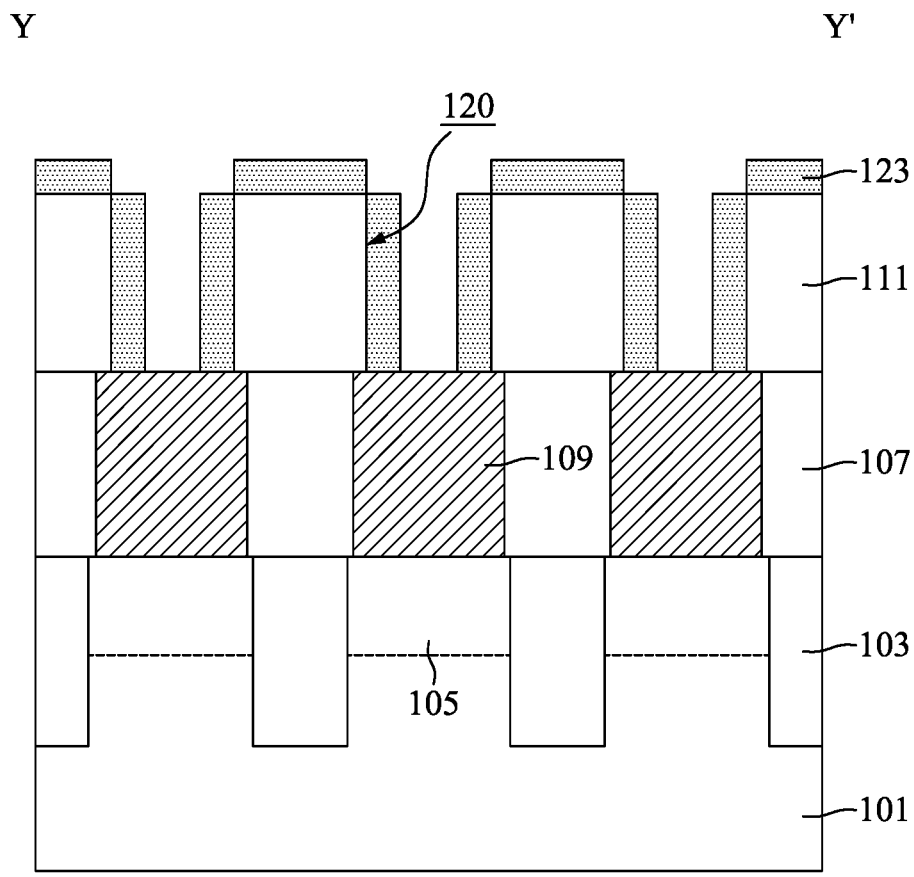
FIG. 20 is a cross-sectional view illustrating an intermediate stage in the formation of the semiconductor device along the sectional line Y-Y' in FIG. 18, in accordance with some embodiments.

After the liner film 123 is etched, the portions of the dielectric layer 111 exposed by the liner film 123 is etched, such that a plurality of first recess 140a and a plurality of second recesses 140b are formed, as shown in FIGS. 18, 19 and 20 in accordance with some embodiments. In some embodiments, each of the openings 120 is connected to one of the first recesses 140a and one of the second recesses 140b. The respective step is illustrated as the step S21 in the method 10 shown in FIG. 5.

The dielectric layer 111 may be etched by a wet etching process, a dry etching process, or a combination thereof. In some embodiments, the liner film 123 is formed from a material that has a high etching selectivity compared to the material of the dielectric layer 111. Therefore, the dielectric layer 111 is etched by using the liner film 123 as a mask.

In some embodiments, the first recesses 140a and the second recesses 140b have tilted sidewalls 111S as shown in FIG. 19. The tilt angles θ between the tilted sidewalls 111S and the liner film 123 are related to the etching time, the temperature, and the pressure of the etching gases. With shorter etching time, lower temperature, and/or lower pressure, smaller tile angles θ are obtained. In some embodiments, the first recesses 140a and the second recesses 140b have curved sidewalls. In addition, as shown in FIG. 19, the first recess 140a has a depth D1, the second recess 140b has a depth D2, and the opening 120 has a depth D3. In some embodiments, the depth D3 is greater than the depth D1 and the depth D2.

Figure 21:
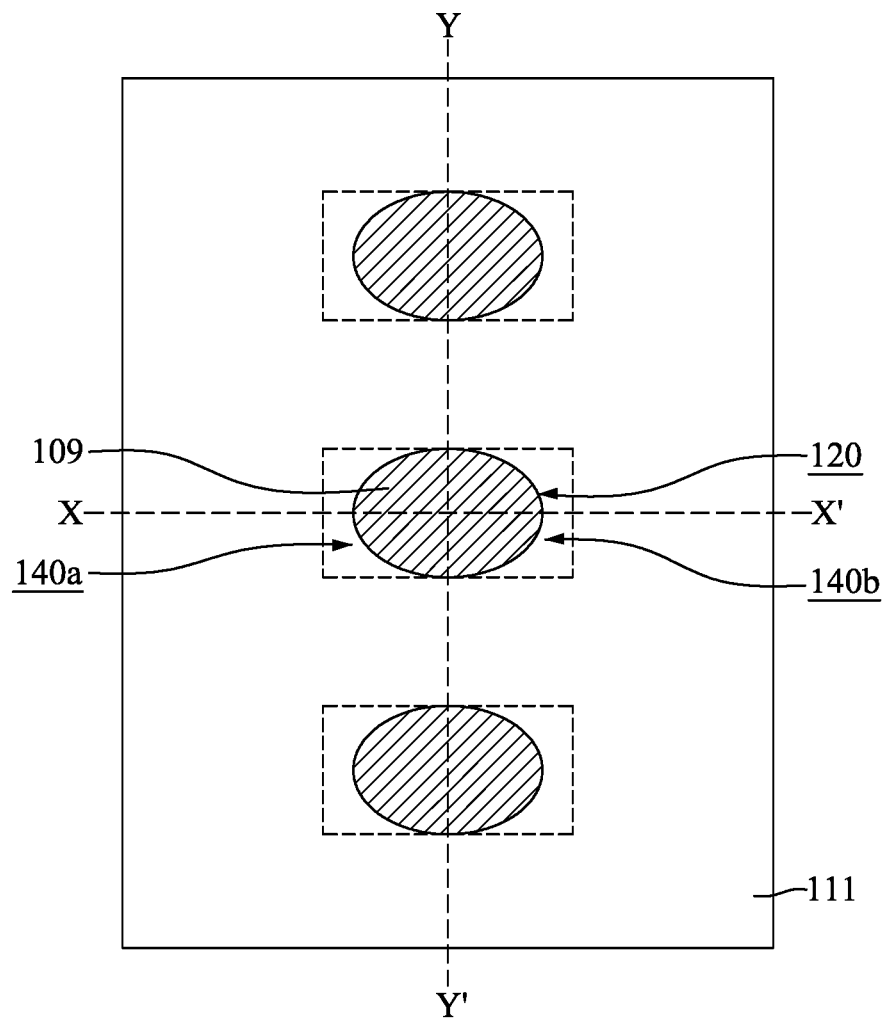
FIG. 21 is a top view illustrating an intermediate stage of removing the liner film during the formation of the semiconductor device, in accordance with some embodiments.
Figure 22:
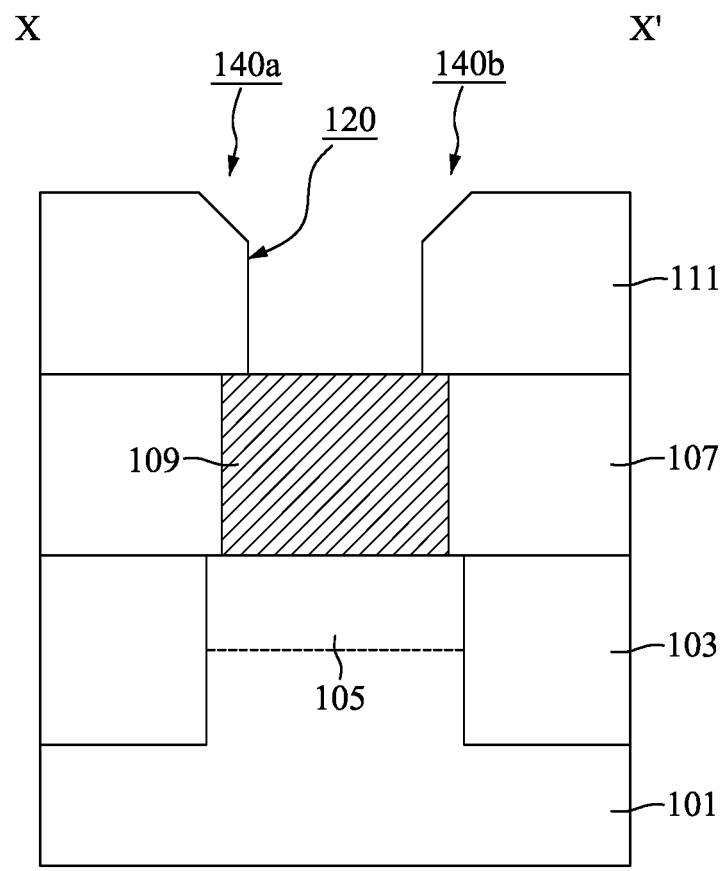
FIG. 22 is a cross-sectional view illustrating an intermediate stage in the formation of the semiconductor device along the sectional line X-X' in FIG. 21, in accordance with some embodiments.
Figure 23:
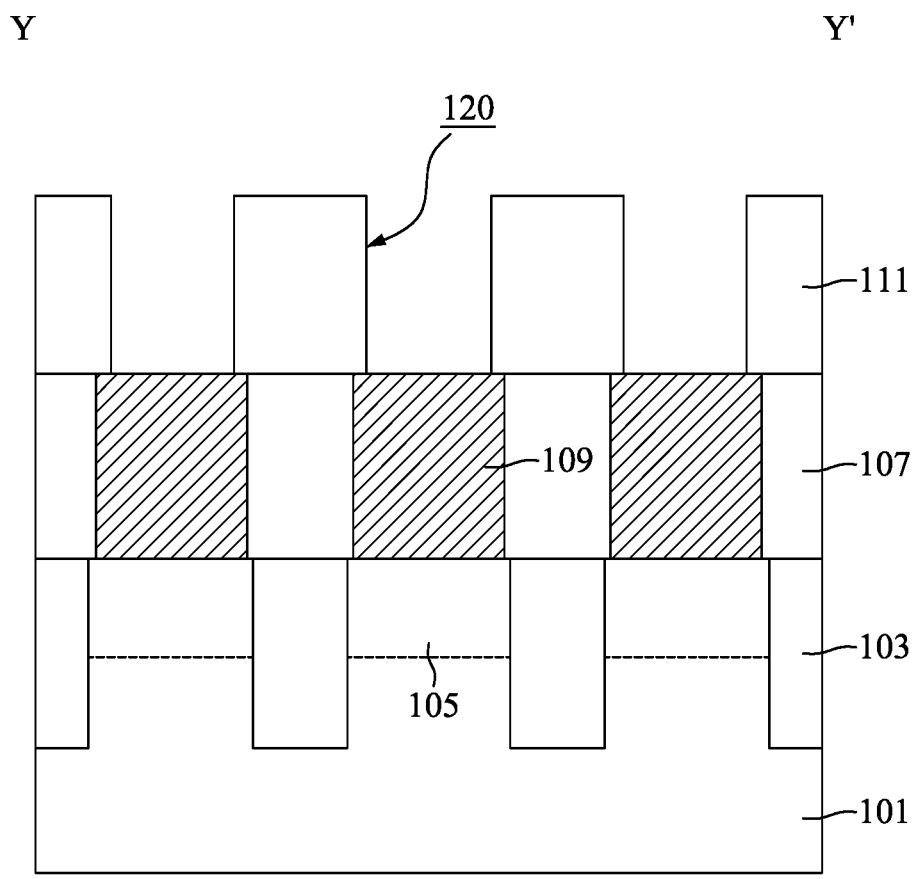
FIG. 23 is a cross-sectional view illustrating an intermediate stage in the formation of the semiconductor device along the sectional line Y-Y' in FIG. 21, in accordance with some embodiments.

Next, the liner film 123 is removed, as shown in FIGS. 21, 22 and 23 in accordance with some embodiments. The respective step is illustrated as the step S23 in the method 10 shown in FIG. 5. In some embodiments, the liner film 123 is removed by an etching process, such as a dry etching process or a wet etching process. In some embodiments, the sectional line Y-Y' depicts a cross-sectional view that cuts through the openings 120 but that does not cut through the first recesses 140a and the second recesses 140b, and thus the first recesses 140a and the second recesses 140b are not illustrated in FIG. 23.

Figure 24:
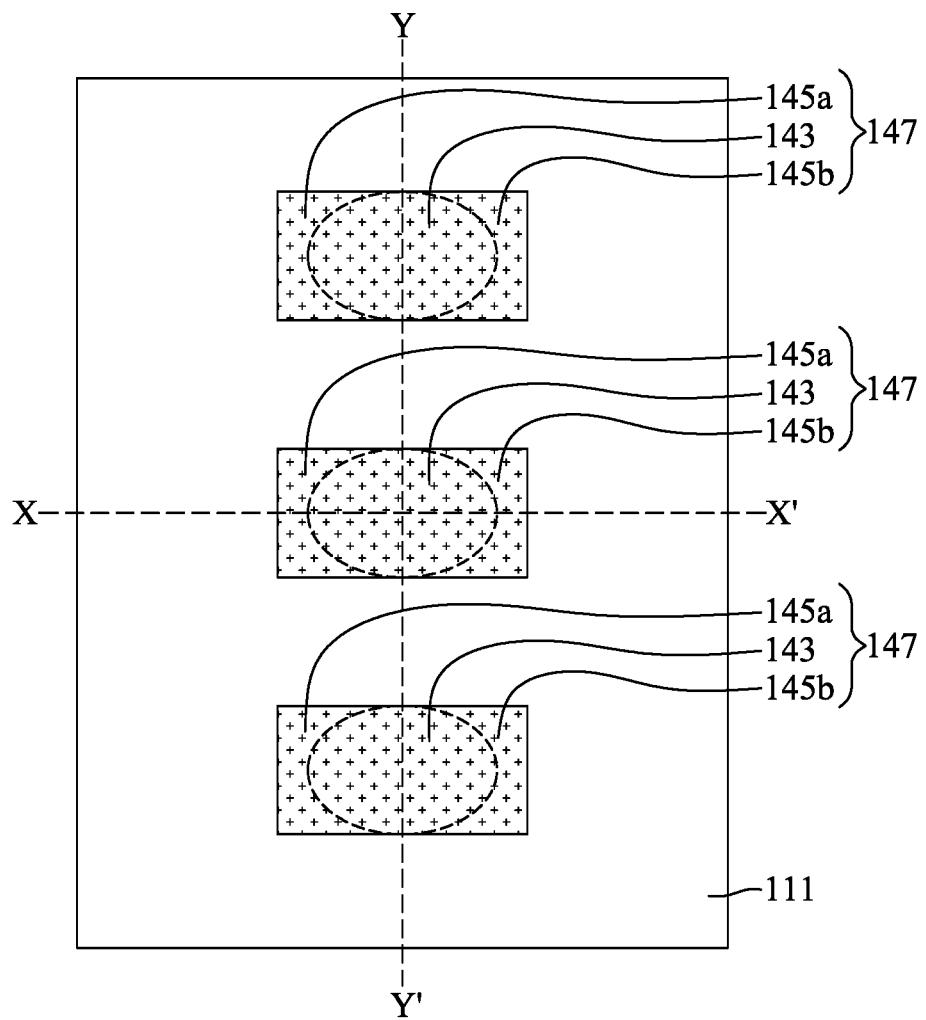
FIG. 24 is a top view illustrating an intermediate stage of forming a conductive contact during the formation of the semiconductor device, in accordance with some embodiments.
Figure 25:
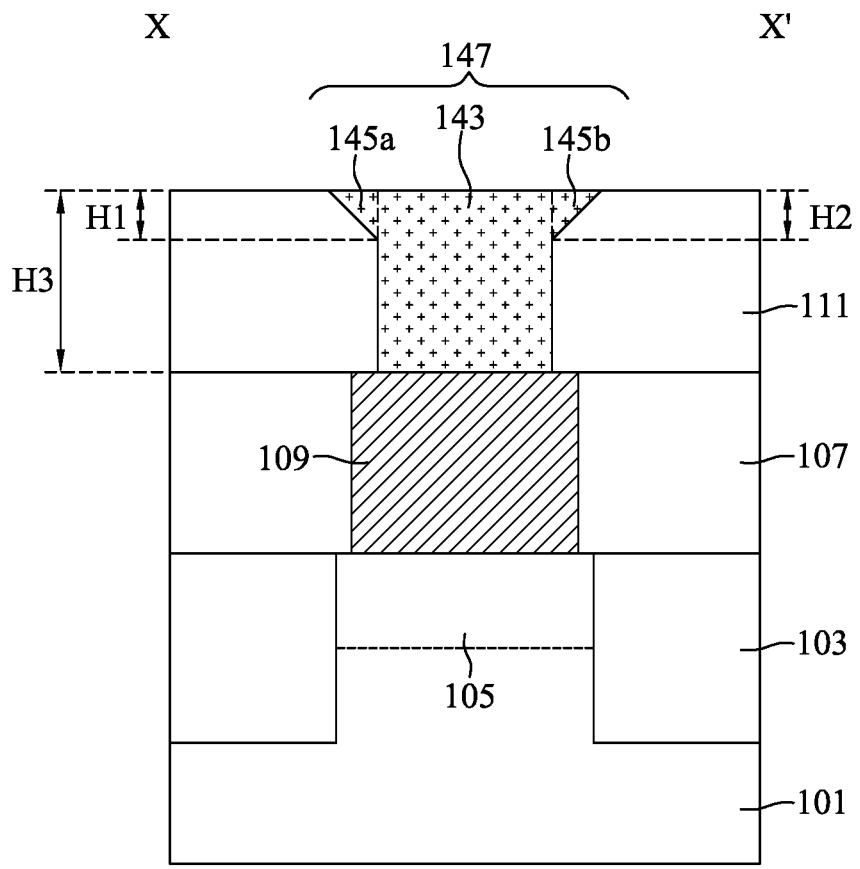
FIG. 25 is a cross-sectional view illustrating an intermediate stage in the formation of the semiconductor device along the sectional line X-X' in FIG. 24, in accordance with some embodiments.
Figure 26:
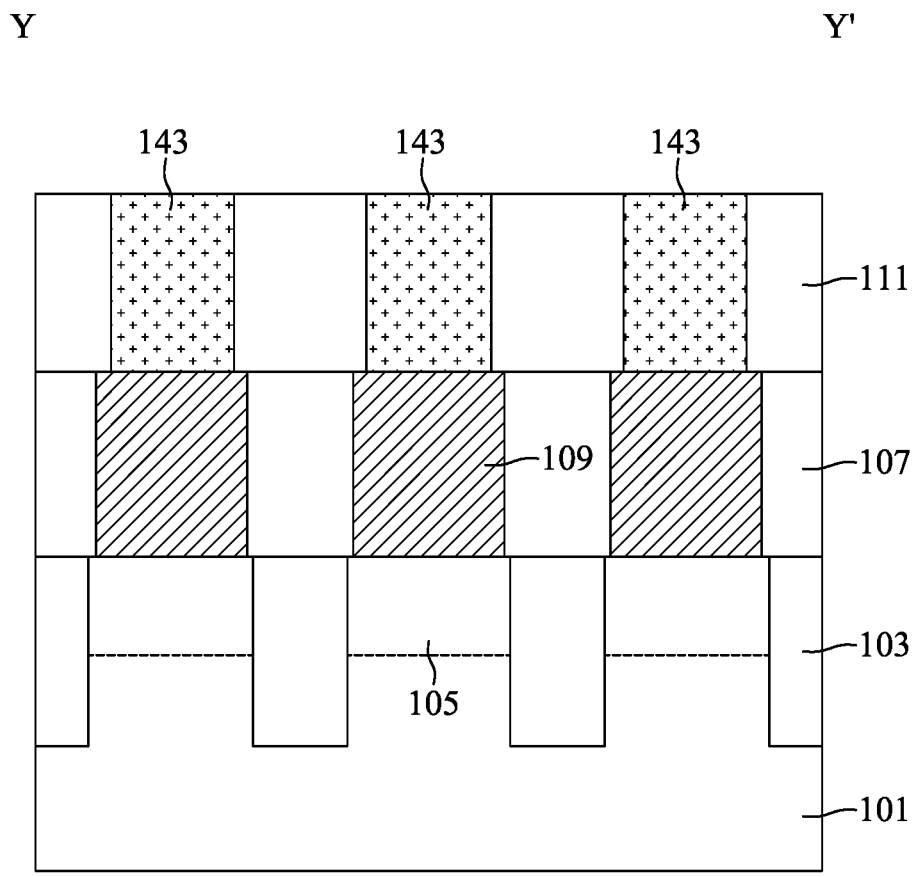
FIG. 26 is a cross-sectional view illustrating an intermediate stage in the formation of the semiconductor device along the sectional line Y-Y' in FIG. 24, in accordance with some embodiments.

After the liner film 123 is removed, the conductive contacts 147 are formed over the conductive layers 109, and the openings 120, the first recesses 140a and the second recesses 140b are filled by the conductive contacts 147, as shown in FIGS. 24, 25 and 26, in accordance with some embodiments. The respective step is illustrated as the step S25 in the method 10 shown in FIG. 5. Specifically, the first recesses 140a are filled by the first expanded portions 145a of the conductive contacts 147, the second recesses 140b are filled by the second expanded portions 145b of the conductive contacts 147, and the openings 120 are filled by the base portions 143 of the conductive contacts 147.

Some materials of the conductive contacts 147 are similar to, or the same as those used to form the conductive layers 109, and details thereof are not repeated herein. In some embodiments, the conductive contacts 147 are formed by depositing a conductive material (not shown) over the top surface of the dielectric layer 111 and filling the openings 120, the first recesses 140a and the second recesses 140b, and polishing the conductive material to form the conductive contacts 147. The conductive material may be deposited by a CVD process, a PVD process, an ALD process, an MOCVD process, a sputtering process, a plating process, or another applicable process. In addition, the conductive material may be polished by a CMP process.

In some embodiments, the top surfaces of the first expanded portions 145a, the top surfaces of the second expanded portions 145b, and the top surfaces of the base portions 143 are coplanar with the top surface of the dielectric layer 111. Moreover, as shown in FIG. 25, the first expanded portion 145a has a height H1, the second expanded portion 145b has a height H2, and the base portion 143 has a height H3. In some embodiments, the height H3 is greater than the height H1 and the height H2.

Next, referring back to FIGS. 1, 2 and 3, the dielectric layer 151 and the conductive lines 153 are formed over the dielectric layer 111 and the conductive contacts 147, in accordance with some embodiments. The respective step is illustrated as the step S27 in the method 10 shown in FIG. 5. Some materials and processes used to form the dielectric layer 151 and the conductive lines 153 are similar to, or the same as those used to form the dielectric layer 107 and the conductive layers 109, and details thereof are not repeated herein. After the conductive lines 153 are formed, the semiconductor device 100a is obtained.

In some embodiments, the first recesses 140a and the second recesses 140b (See FIG. 22) have curved sidewalls. Therefore, the subsequently formed first expanded portions and second expanded portions have curved sidewalls, such as the first expanded portion 145a' and the second expanded portion 145b' of the modified semiconductor device 100b shown in FIG. 4.

Embodiments of the semiconductor devices 100a and 100b are provided in the disclosure. In some embodiments, the conductive contacts 147, 147' have expanded portions (i.e., the first expanded portions 145a, 145a' and the second expanded portions 145b, 145b') laterally extend outward from the base portions 143 and along the longitudinal axis of the conductive lines 153. Therefore, the top surface areas (e.g., the top surface areas 147T, 147'T) of the conductive contacts 147, 147' are greater than the bottom surface areas (e.g., the bottom surface area 147B, 147'B) of the conductive contacts 147, 147', thereby reducing the contact resistance between the conductive contacts 147, 147' and the conductive lines 153. In addition, the conductive contacts 147, 147' do not expand beyond edges of the conductive lines 153, thereby preventing or reducing crosstalk problems between adjacent conductive lines 153 or conductive contacts 147, 147'. As a result, the overall device performance may be improved.

In one embodiment of the present disclosure, a semiconductor device is provided. The semiconductor device includes a conductive layer disposed over a semiconductor substrate, and a conductive contact disposed over the conductive layer. The semiconductor device also includes a conductive line disposed over the conductive contact. An upper portion of the conductive contact has a tapering profile in a first cross-sectional view along a longitudinal axis of the conductive line, and the upper portion of the conductive contact has a non-tapering profile in a second cross-sectional view along a line orthogonal to the longitudinal axis of the conductive line.

In another embodiment of the present disclosure, a semiconductor device is provided. The semiconductor device includes a conductive layer disposed over a semiconductor substrate, and a conductive line disposed over the conductive layer. The semiconductor device also includes a conductive contact disposed between and electrically connecting the conductive layer and the conductive line. The conductive contact includes a base portion, and a first expanded portion and a second expanded portion laterally extend from the base portion. The first expanded portion and the second expanded portion are separated from the conductive layer, and the first expanded portion and the second expanded portion have tapering profiles that taper from the conductive line toward the conductive layer.

In yet another embodiment of the present disclosure, a method for forming a semiconductor device is provided. The method includes forming a conductive layer over a semiconductor substrate, and forming a dielectric layer covering the conductive layer. The method also includes etching the dielectric layer to form an opening exposing the conductive layer, and etching the dielectric layer to form a first recess and a second recess connecting to the opening. A depth of the opening is greater than a depth of the first recess and a depth of the second recess, and the first recess and the second recess have tapering profiles that taper toward the conductive layer. The method further includes forming a conductive contact over the conductive layer. The opening, the first recess and the second recess are filled by the conductive contact. In addition, the method includes forming a conductive line over the conductive contact.

The embodiments of the present disclosure have some advantageous features. By forming a conductive contact having a tapering profile in a cross-sectional view along a longitudinal axis of a conductive line, the contact resistance between the conductive contact and the conductive line can be reduced. As a result, the overall device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a source/drain region disposed in a semiconductor substrate;
a conductive layer disposed over the source/drain region;
a conductive contact disposed over the conductive layer; and
a conductive line disposed over the conductive contact,
wherein the conductive line is electrically connected to the source/drain region through the conductive contact and the conductive layer;
wherein an upper portion of the conductive contact has a tapering profile in a first cross-sectional view along a longitudinal axis of the conductive line, a lower portion of the conductive contact is in direct contact with the conductive layer and has a non-tapering profile in the first cross-sectional view, and the upper portion of the conductive contact has a non-tapering profile in a second cross-sectional view along a line orthogonal to the longitudinal axis of the conductive line;
wherein the tapering profile of the upper portion of the conductive contact includes curved sidewalls inward to the conductive layer;
wherein a width of the conductive layer is greater than a width of the lower portion of the conductive contact.

2. The semiconductor device of claim 1, wherein the tapering profile of the upper portion of the conductive contact in the first cross-sectional view tapers from a top surface of the conductive contact.

3. The semiconductor device of claim 1, wherein an interface area between the conductive contact and the conductive line is greater than an interface area between the conductive contact and the conductive layer.

4. The semiconductor device of claim 1, wherein the conductive contact is entirely covered by the conductive line.

5. The semiconductor device of claim 1, wherein a width of the conductive line is substantially the same as a width of the conductive contact in the second cross-sectional view.

* * * * *